(12) United States Patent
Ogiwara

(10) Patent No.: US 6,219,806 B1
(45) Date of Patent: Apr. 17, 2001

(54) METHOD OF EXECUTING TEST PROGRAMS FOR SEMICONDUCTOR TESTING SYSTEM

(75) Inventor: Hiroyuki Ogiwara, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/079,256

(22) Filed: May 14, 1998

(30) Foreign Application Priority Data

Jun. 6, 1997 (JP) .................................................... 9-165089

(51) Int. Cl.⁷ .................................................... G11C 29/00
(52) U.S. Cl. ............................................ 714/718; 714/721
(58) Field of Search ................................. 714/719, 718, 714/42, 721

(56) References Cited

U.S. PATENT DOCUMENTS

| | | | | |
|---|---|---|---|---|
| 4,736,375 | * | 4/1988 | Tannhauser et al. | 714/743 |
| 5,432,942 | * | 7/1995 | Trainer | 395/708 |
| 5,544,175 | * | 8/1996 | Posse | 714/736 |

* cited by examiner

Primary Examiner—Phung M. Chung
(74) Attorney, Agent, or Firm—Dellett and Walters

(57) ABSTRACT

Disclosed is a method of executing test programs for a semiconductor testing system performing function tests on a semiconductor device through the execution of the test programs by means of an operating system. When a statement of a test program for designating a predetermined set value is executed, the set value is stored in a data area. Then, when a statement on the execution of a function test is executed, the above set value is read to set a corresponding circuit, after which the function tests are carried out.

12 Claims, 5 Drawing Sheets

METHOD OF EXECUTING TEST PROGRAMS FOR SEMICONDUCTOR TESTING SYSTEM

BACKGROUND OF THE INVENTION

1. Field of the Invention

The present invention relates to a method of executing test programs for a semiconductor testing system for performing a variety of function tests on a semiconductor memory or other components.

2. Description of the Related Art

Hitherto known as such semiconductor testing system for running various function tests on the semiconductor memory are ones of two types, that is, per-pin type and shared resource type. The per-pin type semiconductor testing system enables a timing edge defining a switching timing of pattern data or the like to be set for each pin (terminal) of the semiconductor memory to be tested, advantageously making it possible to provide fine settings for the function tests. More specifically, it comprises a timing generator including the same number of timing edge generating circuits as pins of the semiconductor memory, with each timing edge generating circuit capable of generating an arbitrary timing edge.

The shared resource type semiconductor testing system on the other hand has a plurality of timing edges shared by all the pins so that the hardware is conveniently simplified although the reduced degree of freedom in the setting of the timing edge. More specifically, its timing generator includes a timing edge generating circuit common to the pins of the semiconductor memory so that any one is selected for the correlation with the respective pins from among a plurality of (e.g., eight different) timing edges provided by the timing edge generating circuit. Thus, any one is selected from among the eight different timing edges provided by the timing edge generating circuit so as to allow individual correspondence with each pin of the semiconductor memory.

Incidentally, the above per-pin type and shared resource type semiconductor testing systems are both computer controlled and include a processing unit called a tester processor for executing a predetermined test program to run a variety of function tests on the semiconductor memory. Although the test program is generally executed by a predetermined operating system (OS), the per-pin type semiconductor testing system and the shared resource type semiconductor testing system have different operative procedures effected by the tester processor upon the execution of the test program, due to the difference in the timing edge generating mechanisms or the like. For this reason, use must be made of different operating systems depending on whether the semiconductor testing system is of the per-pin type or of the shared resource type, preventing the operating system from being shared.

For example, as described hereinabove, the timing generator contained in the shared resource type semiconductor testing system is provided with a common timing edge generating circuit corresponding to the pins of the semiconductor memory. The instant that the execution is made of a statement of the test program describing values of a plurality of timing edges (e.g., ACLK1, ACLK2, etc.) set by the timing edge generating circuit, corresponding values of the timing edges are set to the timing edge generating circuit.

On the contrary, the timing generator included in the per-pin type semiconductor testing system is provided with a plurality of timing edge generating circuits having one-to-one correspondence with each pin of the semiconductor memory. The timing edge generating circuits are set independently of each other, and the actual setting is performed immediately before the execution of measurement of the output value from the semiconductor memory.

In this manner, regardless of the common test program, the operating system for use in the conventional semiconductor testing system must allow the tester processor to act differently depending on whether the operating system is applied to the per-pin type semiconductor testing system or the shared resource type semiconductor testing system, with the result that there arises a necessity to develop one having different specifications each time, resulting in laborious development of the operating systems.

In addition, the use of different operating systems leads to the tester processor effecting different operative procedures, which means that the function tests are run under different test conditions in the strict sense of the word. Thus, in order to ensure that the function tests are at all times run under the same conditions, it is preferred that the same operative procedure be effected by the tester processor by sharing a single operating system.

It is therefore the object of the present invention to provide a method of executing a test program for a semiconductor testing system, ensuring the same operative procedure upon the execution of a test program irrespective of the type of the semiconductor testing system.

SUMMARY OF THE INVENTION

In a preferred embodiment, a method of executing a test program for a semiconductor testing system of the present invention comprises the steps of, upon the execution of a statement of the test program designating a predetermined set value required for the run of the function test, storing thus designated set value in a predetermined data area; and upon the execution of a statement of the test program providing an instruction on the run of the function test, reading the set value stored in the data area and performing the setting of a corresponding circuit, after which the function test is run.

Even when the function test is performed using the shared resource type semiconductor testing system, there is no need to immediately set a corresponding circuit upon the execution of the statement designating a set value necessary for the run of the function test, thereby making it possible to share the operative procedure upon the execution of the test program with the per-pin type semiconductor testing system.

DESCRIPTION OF THE PREFERRED EMBODIMENTS

A semiconductor testing system embodying the present invention is characterized in that upon the execution of a common test program, various function tests are performed in the same operative procedures no matter whether it is of shared resource type or of per-pin type. An embodiment of the semiconductor testing system will now be described in detail with reference to the accompanying drawings.

[General Configuration of Semiconductor Testing System]

Figure 1:
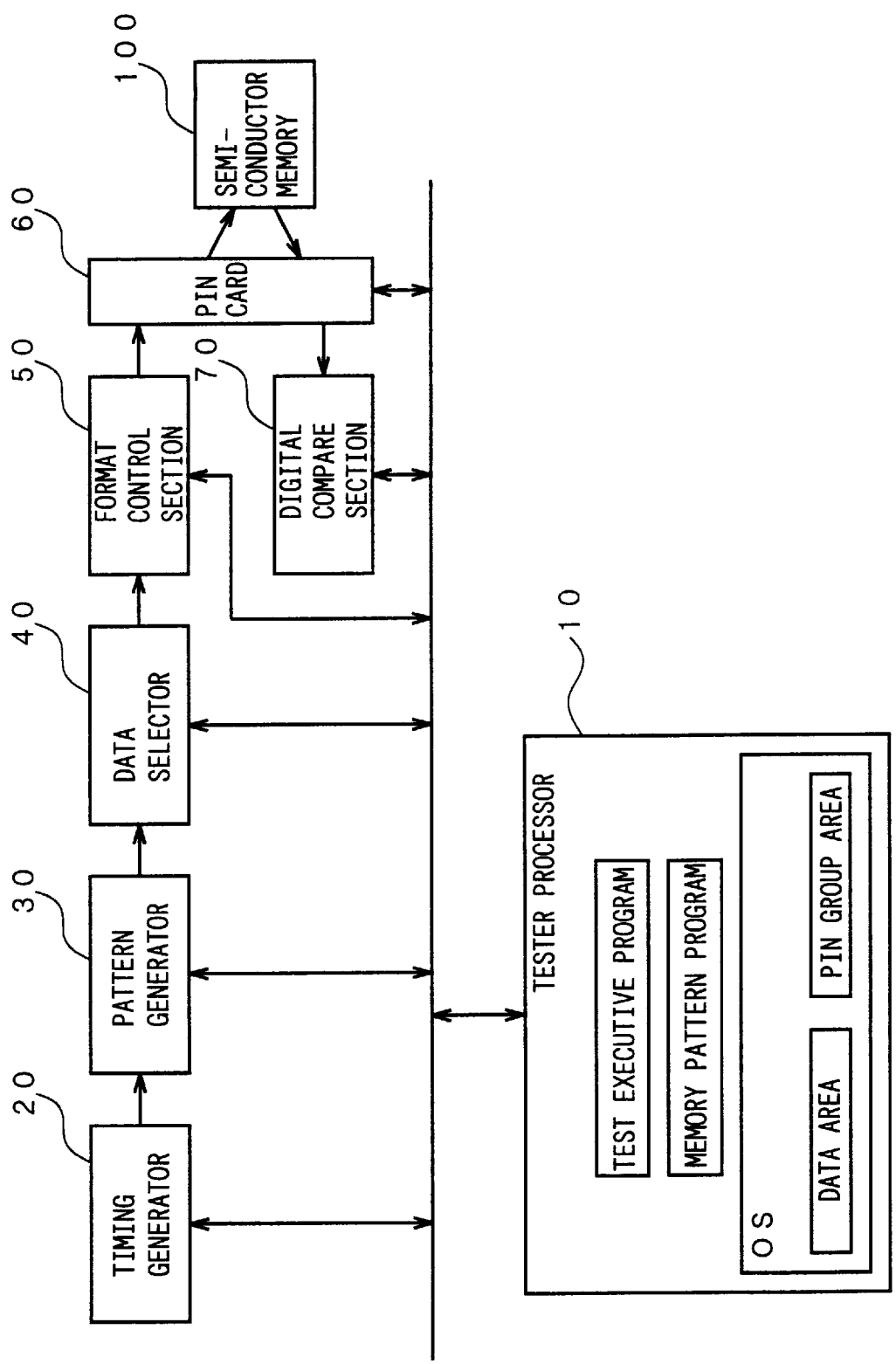
FIG. 1 is a diagram illustrating a configuration of a semiconductor testing system in accordance with this embodiment.

FIG. 1 is a diagram showing a configuration of the semiconductor testing system in accordance with this embodiment. In order to perform the various function tests on a semiconductor memory 100 to be tested, the semiconductor testing system shown in FIG. 1 comprises a tester processor 10, a timing generator 20, a pattern generator 30, a data selector 40, a format control section 50, a pin card 60 and a digital compare section 70.

The tester processor 10 provides a control of the entire semiconductor testing system to allow an operating system (OS) to execute a predetermined test program to thereby perform the functional tests on the semiconductor memory 100. The test program includes a memory pattern program for generating pattern data to be fed to the semiconductor memory 100 for the function tests, and a test executive program for defining test conditions to run the function tests.

The timing generator 20 sets up a basic cycle of the testing action and creates various timing edges contained in the thus set up basic cycle. The pattern generator 30 generates pattern data to be fed to pins of the semiconductor memory 100. The data selector 40 correlates various pattern data delivered from the pattern generator 30 with the pins of the semiconductor memory 100 to receive the data. The format control section 50 provides a waveform control of the semiconductor memory 100 on the basis of pattern data generated by the pattern generator 30 to be selected by the data selector 40 and timing edges created by the timing generator 20.

Figure 2:
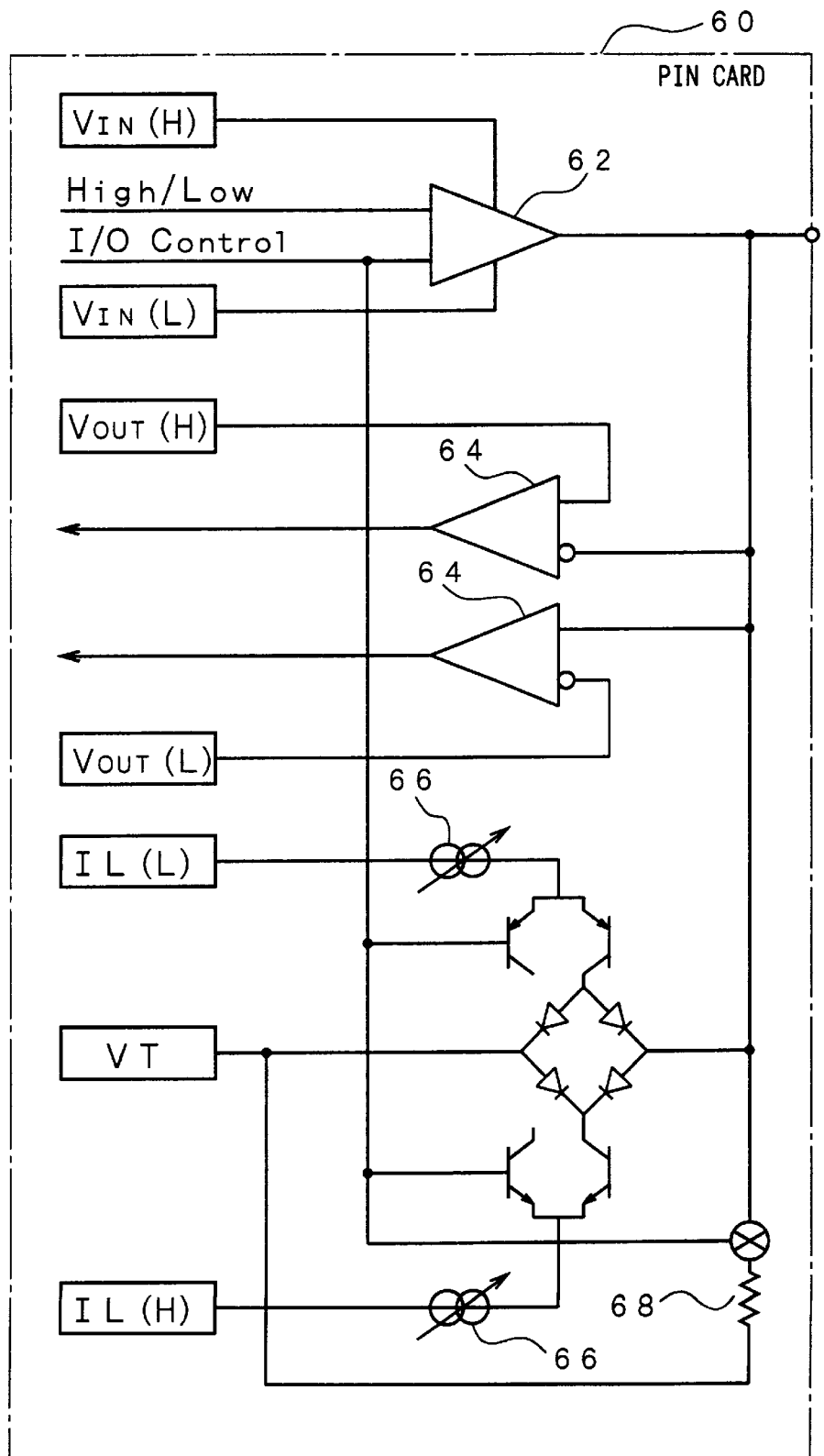
FIG. 2 is a diagram illustrating a partial circuit configuration of a pin card depicted in FIG. 1.

The pin card 60 serves to provide a physical interface with the semiconductor memory 100. FIG. 2 is a diagram illustrating a circuit configuration of the pin card 60, in which is shown a configuration corresponding to one pin of the semiconductor memory 100. As shown in FIG. 2, the pin card 60 includes a driver 62 for applying a predetermined pattern waveform to the associated pin of the semiconductor memory 100, a dual comparator 64 for simultaneously comparing a voltage waveform appearing at the pin both with a predetermined low level voltage and with a predetermined high level voltage, a programmable load 66 allowing optional setting of a value of the load current, and a terminating resistor 68 connected to the pin and having a predetermined resistance value (e.g. 50 Ω). It is to be noted that some pins of the semiconductor memory 100 can serve merely to receive predetermined data like a pin associated with an address terminal and that connected to such a pin is only the driver 62 without necessity for the above dual comparator 64, the programmable load 66 and the terminating resistor 68.

The digital compare section 70 compares an output from each pin of the semiconductor memory 100 with expected value data for each pin selected by the data selector 40. The timing to make this comparison is designated by a timing edge STRB of a strobe signal generated by the timing generator 20.

[Specific Action of Timing Generator]

Description will then be made of a specific action of the timing generator 20 included in the semiconductor testing system shown in FIG. 1. In general, the timing edges generated by the timing generator 20 include timing edges ACLK, BCLK and CCLK for shaping waveforms of the driver 62 shown in FIG. 2, timing edges DREL and DRET for designating on/off of the driver 62, and a timing edge STRB for instructing the digital compare section 70 to measure the test results.

Figure 3:
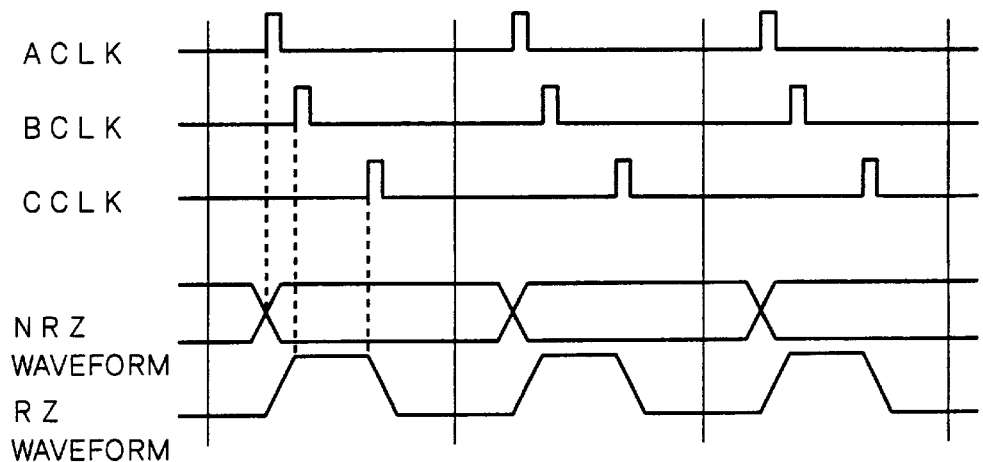
FIG. 3 is a diagram illustrating a relationship between a timing edge for driver waveform shaping and a waveform to be fed to a semiconductor memory.

FIG. 3 is a diagram showing a relationship between the timing edge for the driver waveform shaping and the output waveform from the driver 62 to be fed to the semiconductor memory 100. As shown in FIG. 3, the above timing edge ACLK for the driver waveform shaping is used to determine waveform variation timings upon NRZ (Non-Return-to-Zero) waveform shaping. The timing edge BCLK is used as a leading edge upon RZ (Return-to-Zero) waveform shaping while the timing edge CCLK is used as a trailing edge upon the RZ waveform shaping. It is to be appreciated that such manners of use of the timing edges ACLK, BCLK and CCLK are by way of example and that the timing edge ACLK may be used as a leading edge with the timing edge BCLK or CCLK used as a trailing edge.

Incidentally, the above timing generator 20 is differently configured and acts depending on whether the semiconductor testing system shown in FIG. 1 is of shared resource type or of per pin type.

Figure 4:
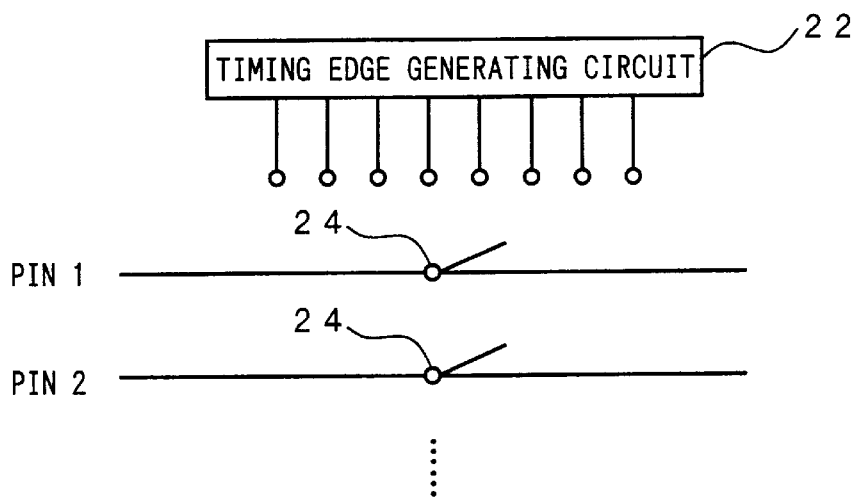
FIG. 4 is a diagram illustrating a schematic configuration of a timing generator included in a shared resource type semiconductor testing system.

FIG. 4 is a diagram illustrating a schematic configuration of the timing generator 20 included in the shared resource type semiconductor testing system. As shown in FIG. 4, the timing generator 20 included in the shared resource type semiconductor testing system has a common timing edge generating circuit 20 corresponding to the pins of the semiconductor memory 100. The timing edge generating circuit 22 is provided correspondingly to the various timing edges ACLK, BCLK, etc., and is capable of generating a plurality of (e.g., eight) timing edges different from one another. For example, the timing generating circuit 22 corresponding to ACLK generates eight timing edges ACLK1 to ACLK8 as selection candidates.

The timing generator 20 has a corresponding number of selectors 24 associated with the pins of the semiconductor memory 100 so that the selectors 24 can be switched to allocate eight timing edges ACLK1 to ACLK8 issued from the timing edge generating circuit 22 to the pins. The same applies to the other timing edges BCLK, CCLK, DREL, etc., than ACLK. For example, each pin is provided with a selector 24 for selecting one from eight candidate values prepared by the corresponding timing edge generating circuit 22 so that these selectors 24 are switched to select one of the eight candidates prepared in correspondence with the timing edges BCLK, etc.

Figure 5:
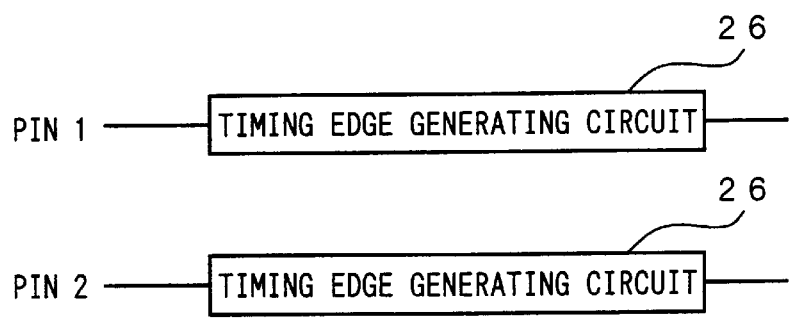
FIG. 5 is a diagram illustrating a schematic configuration of a timing generator included in a per-pin type semiconductor testing system.

FIG. 5 is a diagram illustrating a schematic configuration of the timing generator 20 included in the per-pin type semiconductor testing system. As shown in FIG. 5, the timing generator 20 included in the per-pin type semiconductor testing system has a plurality of timing edge generating circuits 26 having a one-to-one correspondence with the pins of the semiconductor memory 100. The timing edge generating circuits 26 are each capable of generating the various timing edges ACLK, BCLK, CCLK, DREL, DRET, STRB, etc., independently of one another. In addition, it would be possible that their respective timing edges ACLK, etc., have optional values on a pin-to-pin basis.

[Control Action by Tester Processor]

Figure 6:
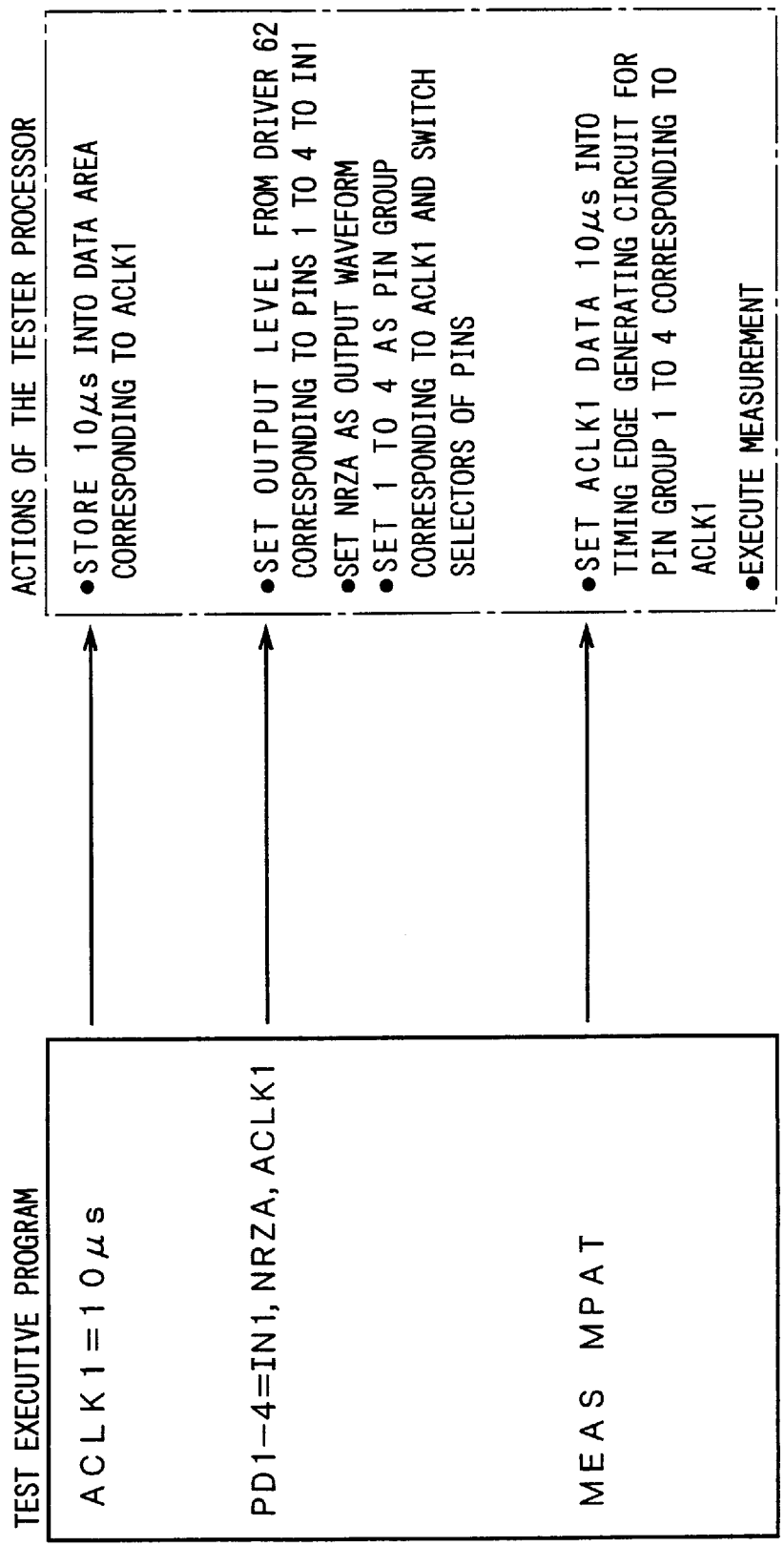
FIG. 6 is a diagram illustrating an operative procedure in the case where a test executive program is executed by an operating system.

The semiconductor testing system in accordance with the present invention has the above configuration. Description will then be made of action in the case where the various timing edges are set in correspondence with the pins through the execution of a predetermined test executive program. For instance, consideration is given of the action in the case where the test executive program partially contains statements ACLK1=10 $\mu$s
PD1-4=IN1, NRZA, ACLK1
MEAS MPAT FIG. 6 is a diagram illustrating a procedure of actions of the tester processor 10 when the above statements of the test executive program are executed by the operating system.

As shown in the diagram, through the execution of the statement (ACLK1=10 $\mu$s) on the first line of the test executive program by use of the operating system, the tester processor 10 reserves a data area corresponding to ACLK1 and stores 10 $\mu$s as data for designating a timing at which the timing edge ACLK1 occurs in the data area. This action is made in common no matter whether the semiconductor testing system concerned is of the shared resource type or of the per-pin type.

Then, through the execution of the statement (PD1-4= IN1, NRZA, ACLK1) on the second line by use of the operating system, the tester processor 10 sets the output level and output waveform from the driver 62 corresponding to the pins 1 to 4 of the semiconductor memory 100 to IN1 (which will be described later) and NRZA (a sort of NRZ waveform), respectively, and reserves a pin group area for setting therein a pin group corresponding to ACLK1 to store 1 to 4 in that area. Furthermore, for the pins 1 to 4 of the semiconductor memory 100, the tester processor 10 switches the selector 24 in the timing generator 20 shown in FIG. 4 to ACLK1 of the timing generating circuit 22 corresponding to ACLK. It is to be noted in the case of the per-pin type semiconductor testing system as shown in FIG. 5 that the procedure is effected till the setting of the pin group corresponding to ACLK1 due to the absence of the selectors 24 shown in FIG. 4 in the timing generator 20.

Then, the tester processor 10 executes the statement (MEAS MPAT) on the third line of the test executive program to start a predetermined measuring action. Previous to the measuring action, however, the tester processor 10 reads 10 $\mu$s as a set value of ACLK1 from the data area to perform the setting of a timing edge corresponding thereto. More specifically, in the case of the per-pin type semiconductor testing system, the tester processor 10 reads the pin group 1 to 4 of ACLK1 from the pin group area and reads data 10 $\mu$s corresponding to ACLK1 from the data area to thereby set logs as the timing edge data of ACLK1 in the timing edge generating circuits 26 corresponding one for one to the pins 1 to 4 in the timing generator 20. On the contrary, in the case of the shared resource type semiconductor testing system, the tester processor 10 reads data 10 $\mu$s corresponding to ACLK1 from the data area to thereby set 10 $\mu$s to the timing edge ACLK1 of the timing edge generating circuit 22 corresponding to ACLK in the timing generator 20. Subsequently, a predetermined measuring action is carried out.

In this manner, upon execution of the statements of the test executive program to set a specific value of the timing edge ACLK1, the tester processor 10 of this embodiment does not take a predetermined setting action directly on the timing edge generating circuit 22 in the timing generator 20 even in the case of the shared resource type semiconductor testing system, but temporarily stores 10 $\mu$s as its specific set value in the data area reserved in correspondence with the ACLK1. Thus, upon the execution of these statements, the tester processor 10 has the same operative procedure no matter whether the semiconductor testing system is of the shared resource type or of the per-pin type, enabling the hardware such as the associated timing generator 20 to employ the same operative procedure at the time of the execution of the same statement. As a result, both the shared resource type and per-pin type semiconductor testing systems can employ the same test conditions in the strict sense of the word, thereby making it possible to improve the reliability of the test.

From the fact that upon the execution of the test executive program the same operative procedure is applied to the tester processor 10 of both the shared resource type and per-pin type semiconductor testing systems, there is ensured an availability of a common operating system, eliminating the necessity to develop different operating systems depending on the type of semiconductor testing systems, that is, on whether it is of the shared resource type or of the per-pin type, thus contributing to a reduction in labor hour and cost required for the development of the operating systems.

It will be appreciated that the present invention is not intended to be limited to the above embodiment and that a variety of modifications would be possible without departing from the spirit of the present invention. For instance, although the above description of this embodiment has been made on the action of the tester processor 10 in the case of the execution of the test executive program using the timing edge ACLK by way of example, the same applies to the case of setting specific values to the other timing edges BCLK, CCLK, DREL, DRET and STRB.

Furthermore, although in the above embodiment the operative procedure of the tester processor 10 for setting the timing edge ACLK, etc., is common to both the shared resource type and the per-pin type semiconductor testing system, the same applies to the case of setting various voltage and current values other than the timing edges necessary for the execution of the function tests.

The various parameters to be set other than the timing edges can include for instance a parameter IN (VIN(H) and VIN(L) shown in FIG. 2) for setting drive voltage levels (output voltage levels) of the driver 62 corresponding to the pins included in the pin card 60, a parameter OUT (VOUT (H) and VOUT(L) shown in FIG. 2) for setting an upper threshold value and a lower threshold value of the dual comparator 64 included in the pin card 60, a parameter IL (IL(H) and IL(L) shown in FIG. 2) for setting a load current value of the programmable load 66 included in the pin card 60, and a parameter VT for setting a voltage level at the other end of the terminating resistor 68 associated with the pins included in the pin card 60. In order to perform the setting of the various parameters, any one is selectively used of a plurality of candidates prepared by the voltage generating circuit or the current generating circuit common to the pins in the shared resource type semiconductor testing system, whereas independent setting on a pin-to-pin basis can be achieved by the voltage generating circuit or the current generating circuit provided for each pin in the per-pin type semiconductor testing system. In this manner, the basic setting methods are common to both the setting of the above IN and other parameters and the setting of the timing edges so that the present invention is applicable to the case of the setting of the IN and other parameters.

It is to be appreciated in the shared resource type semiconductor testing system that for the various types of setting, the timing edge generating circuit 22 shown in FIG. 4 is replaced by a voltage generating circuit or a current generating circuit so that the pin card 60 includes the voltage generating circuit, the current generating circuit and the selectors corresponding to the pins. In the per-pin type semiconductor testing system, the timing edge circuits 26 shown in FIG. 5 are replaced by voltage generating circuits or current generating circuits so that the pin card 60 includes the voltage generating circuits and the current generating circuits.

When considering the parameter IN for setting the drive voltage level of the driver 62 as an example of the various types of setting, consideration is given of the action in the case where the test executive program partially contains statements

IN1=3V, 1V

PD1–4=IN1

MEAS MPAT

Figure 7:
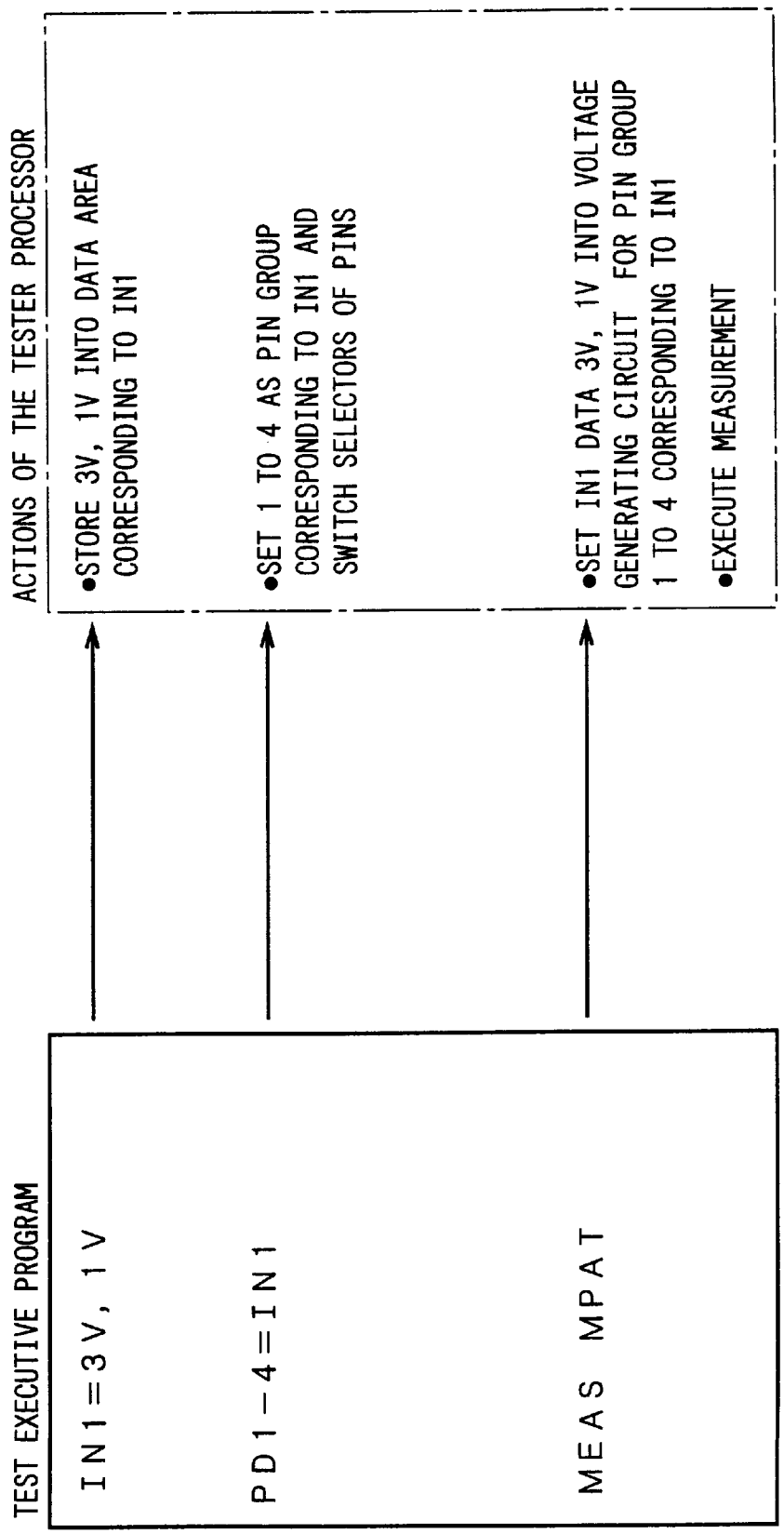
FIG. 7 is a diagram illustrating an operative procedure in the case where another test executive program is executed by the operating system.

FIG. 7 is a diagram illustrating an operative procedure of the tester processor 10 when the statements of the test executive program are executed by the operating system.

As shown in the diagram, the tester processor 10 executes the statement (IN1=3V, 1V) on the first line of the test executive program by use of the operating system to thereby reserve a data area corresponding to IN1 and store 3V, 1V as data for designating the upper level VIN(H) and the lower level VIN(L), respectively, of the output voltage of the driver 62 in the data area. This action is performed in common no matter whether the semiconductor testing system concerned is of the shared resource type or of the per-pin type.

Then, the tester processor 10 executes the statement (PD1–4=IN1) on the second line of the test executive program by use of the operating system to thereby reserve a pin group area for setting a pin group corresponding to IN1 and store 1 to 4 in this area. For the pins 1 to 4 of the semiconductor memory 100, the tester processor 10 allows the selectors (which correspond to the selectors 24 shown in FIG. 4 as described hereinbefore) within the pin card 60 to switch to IN1 of the voltage generating circuit corresponding to the parameter IN. It is to be noted in the case of the per-pin type semiconductor testing system that the procedure is performed till the setting of the pin group corresponding to IN1 because of the absence of the selectors corresponding to the pins in the pin card 60.

Then, the tester processor 10 executes the statement (MEAS MPAT) on the third line of the test executive program to start a predetermined measuring action. Prior to the measuring action, however, the tester processor 10 reads 3V, 1V as set values for IN1 from the data area to set driver output voltages corresponding thereto. More specifically, in the case of the per-pin type semiconductor testing system, the tester processor 10 reads a pin group 1 to 4 from the pin group area and reads data 3V, 1V corresponding to IN1 from the data area to set 3V, 1V as IN1 data to the voltage generating circuits corresponding to the pins 1 to 4 within the pin card 60. On the contrary, in the case of the shared resource type semiconductor testing system, the tester processor 10 reads data 3V, 1V corresponding to IN1 from the data area to set 3V, 1V to IN1 of the voltage generating circuit corresponding to the parameter IN in the pin card 60. Afterwards, a predetermined measuring action is performed.

In this manner, upon the execution of the statements of the test executive program to set IN1 as a specific value in the setting of the driver output voltage IN and other parameters, the tester processor 10 of this embodiment does not take a predetermined setting action directly on the voltage generating circuit within the pin card 60 even in the case of the shared resource type semiconductor testing system but temporarily stores 3V, 1V as its specific set values into the data area reserved in correspondence with the IN1. Accordingly, the operative procedure of the tester processor 10 upon the execution of the statements is common to both the shared resource type and per-pin type semiconductor testing systems, enabling the hardware such as the corresponding pin cards 60 to employ the same operative procedure at the time of the execution of the same statement. As a result, both the shared resource type and per-pin type semiconductor testing systems can employ the same test conditions in the strict sense of the word, thereby making it possible to improve the reliability of the test.

From the fact that upon the execution of the test executive program the same operative procedure is applied to the tester processor 10 of both the shared resource type and per-pin type semiconductor testing systems, there is ensured an availability of a common operating system, eliminating the necessity to develop different operating systems depending on the type of semiconductor testing systems, that is, on whether it is of the shared resource type or of the per-pin type, thus contributing to a reduction in labor hour and cost required for the development of the operating systems.

Although consideration has been given of the semiconductor testing system performing the function tests on the semiconductor memory 100 in the above embodiment, the semiconductor device to be tested is not limited to the semiconductor memory, but may be various types of processors, logic ICs, etc..

What is claimed is:

1. A method of executing a test program for a semiconductor testing system which runs a predetermined function test on a semiconductor device through the execution of a test program by use of an operating system, said method comprising the steps of:

upon the execution of a statement of said test program designating a predetermined set value required for the run of said function test, storing thus designated set value in a predetermined data area; and upon the execution of a statement of said test program providing an instruction on the run of said function test, reading said set value stored in said data area and performing the setting of a corresponding circuit, after which said function test is run.

2. A method of executing a test program according to claim 1, wherein said circuit is a timing edge generating circuit, and wherein said set value is data designating a timing at which occurs a timing edge issued from said timing edge generating circuit.

3. A method of executing a test program according to claim 2, wherein said timing edge is used to shape an output waveform from a driver to be applied to pins of said semiconductor device to be tested.

4. A method of executing a test program according to claim 2, wherein said timing edge is used to provide an instruction on the status of operation of said driver connected to said pins of said semiconductor device to be tested.

5. A method of executing a test program according to claim 2, wherein said timing edge is used to provide an instruction on a timing at which a voltage comparator compares a voltage appearing at each pin of said semiconductor device to be tested with a predetermined threshold value.

6. A method of executing a test program according to claim 1, wherein said circuit is a voltage generating circuit, and wherein said set value is data designating an output voltage value from said voltage generating circuit.

7. A method of executing a test program according to claim 6, wherein said voltage generating circuit sets a drive voltage level of a driver to be applied to each pin of said semiconductor device to be tested.

8. A method of executing a test program according to claim 6, wherein said voltage generating circuit sets a threshold value of a voltage comparator to be compared with a voltage appearing at each pin of said semiconductor device to be tested.

9. A method of executing a test program according to claim 6, wherein said voltage generating circuit sets a voltage level at the other end of a terminating resistor connected to each pin of said semiconductor device to be tested.

10. A method of executing a test program according to claim 1, wherein said circuit is a current generating circuit, wherein said set value is an output current value of said current generating circuit.

11. A method of executing a test program according to claim 10, wherein said current generating circuit sets a load current value of each pin of said semiconductor device to be tested.

12. A method of executing a test program according to claim 1, wherein said operating system is shared by a shared resource type semiconductor system and a per-pin type semiconductor system.

* * * * *

UNITED STATES PATENT AND TRADEMARK OFFICE
CERTIFICATE OF CORRECTION

PATENT NO.   : 6,219,806 B1
DATED        : April 17, 2001
INVENTOR(S)  : Hiroyuki Ogiwara It is certified that error appears in the above-identified patent and that said Letters Patent is hereby corrected as shown below:

Title page,
Item [75], the inventor's address " Saitama(JP)" should be -- Tokyo (JP) --

Signed and Sealed this

Thirtieth Day of October, 2001

Attest:

*Nicholas P. Godici*

NICHOLAS P. GODICI
*Attesting Officer*        *Acting Director of the United States Patent and Trademark Office*